United States Patent [19]

Takemura

[11] Patent Number: 5,362,709
[45] Date of Patent: Nov. 8, 1994

[54] SUPERCONDUCTING DEVICE

[75] Inventor: Yasuhiko Takemura, Atsugi, Japan

[73] Assignee: Semiconductor Energy Laboratory, Co., Ltd., Kanagawa, Japan

[21] Appl. No.: 796,919

[22] Filed: Oct. 22, 1991

Related U.S. Application Data

[63] Continuation of Ser. No. 553,617, Jul. 18, 1990, abandoned, which is a continuation-in-part of Ser. No. 406,061, Sep. 12, 1989, Pat. No. 5,061,971.

[30] Foreign Application Priority Data

Sep. 22, 1988 [JP] Japan .................. 63-239256
Jul. 22, 1989 [JP] Japan .................. 1-189328

[51] Int. Cl.$^5$ .................. H01L 39/00; H01L 39/22
[52] U.S. Cl. .................. 505/190; 257/31; 257/32; 257/33; 257/35
[58] Field of Search .................. 357/5, 4; 307/306; 505/1; 257/35, 25

[56] References Cited

U.S. PATENT DOCUMENTS

| | | | |
|---|---|---|---|
| 4,316,785 | 2/1982 | Suzuki et al. | 257/35 |
| 4,768,069 | 8/1988 | Talvacchio et al. | 357/5 |
| 4,880,771 | 11/1989 | Cava et al. | 505/1 |
| 4,980,580 | 12/1990 | Ghoshal | 307/306 |
| 5,026,682 | 6/1991 | Clark et al. | 357/5 |
| 5,051,396 | 9/1991 | Yamazaki | 357/5 |
| 5,053,383 | 10/1991 | Short et al. | 357/5 |
| 5,057,491 | 10/1991 | Housley | 505/1 |
| 5,061,971 | 10/1991 | Takemura | 257/35 |
| 5,075,281 | 12/1991 | Testardi | 505/1 |
| 5,087,605 | 2/1992 | Hegde et al. | 505/1 |
| 5,106,819 | 4/1992 | Takemura | 257/35 |

FOREIGN PATENT DOCUMENTS

| | | | |
|---|---|---|---|
| 0325877 | 8/1989 | European Pat. Off. | 357/5 |
| 57-159074 | 10/1982 | Japan | 357/5 |

OTHER PUBLICATIONS

K. Schulze, et al. "Phase Equilibria in the System $Bi_2O_3$-SrO-CaO-CuO With Emphasis on the High-Tc Superconducting Compounds," Z. Metallkol., 81(11), 836-42 (Eng) 1990.

P. Strobel, et al. "Phase Diagram Studies in the Bi(P-G)-Sr-Ca-Cu-O System" Journal of the Less Common Metab, 164 & 165 (1990) 519-525.

Subramanian et al "A New High-Temperature Superconductor:$B_1Sr_{3-x}Ca_xCu_2O_{8+y}$" Science vol. 239 (Feb. 26, 1988) pp. 1015-1017.

Akoh et al "S-N-S Josephson Junction Consisting of YBaCuO/Au/Nb Thin Films" Jap. J. Appl. Phys. vol. 27 No. 4 (Apr. 1988) pp. L519-L521.

Face et al "Preparation of Superconducting Thin Films of BiSrCaCuOs by Reactive Sputtering" Appl. Phys. Lett. vol. 53 No. 3 (Jul. 18, 1988) pp. 246-248.

Primary Examiner—Andrew J. James
Assistant Examiner—Alice W. Tang
Attorney, Agent, or Firm—Sixbey, Friedman, Leedom & Ferguson

[57] ABSTRACT

A superconducting tunnel junction is disclosed herein. The superconducting tunnel junction is characterized in that a pair of oxide superconducting layers thereof and a tunnel barrier layer located between the oxide superconducting layers have the same or almost the same crystal structure and the same or almost the same lattice constant in a direction of a, b, or c axis. The layers have good crystallization.

18 Claims, 3 Drawing Sheets

SUPERCONDUCTING DEVICE

This application is a continuation of Ser. No. 07/553,617, filed Jul. 18, 1990, now abandoned, which was a continuation-in-part of Ser. No. 07/406,061, filed Sep. 12, 1989, now U.S. Pat. No. 5,061,971.

BACKGROUND OF THE INVENTION

1. Field of the Invention

The present invention relates to a superconducting junction using an oxide superconducting material.

2. Description of the Prior Art

A superconducting tunnel junction is commonly known as a Josephson junction and is expected to find considerable application as a high speed device. Conventionally, a junction comprising a pair of superconductors and a thin(100 to 10,000 Å) insulating film, a thin conductor film, a thin good conductor film, or a thin semiconductor film or the like interposed between the superconductors is known as a Josephson junction. Considerable research is being conducted into the utilization of a Josephson junction as an ultrahigh speed computer element., see H. Nakagawa et al.: 1986 Applied Superconductivity Conference. In particular, in the case where the insulating film is used, it is known as an SIS junction; when a conductor film or a semiconductor film is used, as an SNS junction. The characteristics of these two junctions differ slightly.

Conventionally, a metallic material with a low critical temperature has been used as a superconductor, with liquid helium used as a cooling medium. In recent years, oxide superconductors with critical temperatures exceeding the temperature of liquid nitrogen, or even exceeding an absolute temperature of 90 degrees, have been discovered could see H. Maeda et al.: *Japanese Journal of Applied Physics* Vol. 27, No. 2, February, 1988 pp. L209–L210. These oxide superconductors can be represented by the chemical formula $Bi_2Sr_2Ca_{n-1}Cu_nO_{2n+4}$ (where n=1,2,3,. . .). Trials are being conducted to fabricate tunnel junctions using these oxide superconductors.

Because the coherent lengths of these oxide superconductors are very small, ranging from 1 angstrom to dozens angstrom, it is very difficult to form the SIS type of tunnel junction using the oxide superconductors. The reason for this is that, in order to form a Josephson junction with good characteristics, the tunnel barrier must be an ultrathin film with a thickness not more than 100 Å. In particular, this type of tunnel junction, which comprises a thin lower superconducting film, a thin tunnel barrier film on the thin lower superconducting film, and a thin upper superconducting film on the thin tunnel barrier film, is fabricated in the form of these three thin films and since the c-axes in the thin films are parallel to the thickness direction of the thin films, the tunnel barrier film must have a thickness up to several angstrom units which is substantially the same as the coherent lengths of the superconducting layers in the c-axis directions. It is impossible to form such a thin film by the current technology.

Owing to the progress occurring in a thin film formation technology, it has become possible to grow the thin film of an oxide superconductor epitaxially on a suitable substrate, see N. Terada et al.: *Japanese Journal of Applied Physics* Vol. 27 No. 4, April 1988, pp. L639–L642. However, it is impossible to further form a tunnel barrier film of substantially less than 100 Å on the thin film and then properly form an oxide superconducting film in good crystallization on this tunnel barrier film.

The reason for this is as follows. The crystal structure of the magnesium oxide film, aluminum oxide film and the like used in a tunnel junction together with a pair of conventional metallic superconductor films differs from the crystal structure of $Bi_2Sr_2Ca_{n-1}Cu_nO_{2n+4}$ and therefore the formations of these thin films in good crystallization for a junction are impossible, so that it has not been possible to form a good Josephson junction.

In the SNS junction, the thickness of the tunnel barrier layer depends on the mean free path of the carrier in the material making up the tunnel barrier layer. Taking gold as an example, the thickness of the tunnel barrier layer is about 100 Å at 77 K so that there are no problems from the aspect of fabrication. However, in order to obtain good superconductivity, the superconducting layer on the tunnel barrier layer must have a single crystalline structure identical to the superconducting layer under the tunnel barrier layer. Accordingly, in the process for successively laminating the superconducting layer, the tunnel barrier layer, and the superconducting layer, these layers must be formed by heteroepitaxial growth. This means that the use of gold, silicon, etc. having a crystal structure completely different from that of the oxide superconducting layers was suitable for the conventional SNS junction but is not suitable for the SNS junction using an oxide superconductor.

SUMMARY OF THE INVENTION

An object of the present invention is to provide, with due consideration to the drawbacks of such conventional devices, a superconducting tunnel junction formed using an oxide superconductor and to fabricate the superconducting tunnel junction which can be used at a high temperature exceeding the temperature of liquid nitrogen.

This object is achieved in the present invention by the provision of a superconducting tunnel junction comprising a pair of oxide superconducting layers and a tunnel barrier layer interposed between the oxide superconducting layers wherein the oxide superconducting layers and the tunnel barrier layer have the same crystal structure or almost the same crystal structure and almost the same lattice constant to each other. In this case it is preferred that a carrier has a long mean free path in the tunnel barrier layer. Owing to the same crystal structure or almost the same crystal structure and almost the same lattice constant, a heteroepitaxial growth is performed when the tunnel barrier layer is formed on the lower oxide superconducting layer and the upper oxide superconducting layer is formed on the tunnel barrier layer. The tunnel barrier layer may be made of an insulating material, conducting material, or semiconductor material.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Embodiment No. 1

In this embodiment of the present invention, for the oxide superconducting layer, $Bi_2Sr_2Ca_{n-1}Cu_nO_{2n+4}$ with n=2, or specifically, $Bi_2Sr_2CaCu_2O_8$ was used. For the tunnel barrier layer, $Bi_2Sr_{1-x}Ca_xO_6$ with x=0, or specifically, $Bi_2SrO_y$ was used.

The $Bi_2SrO_y$ layer is insulating and has the same crystal structure as the $Bi_2Sr_2CaCu_2O_8$ layer and has a lattice constant of an a-axis length of 5.4 Å identical to that of the $Bi_2Sr_2CaCu_2O_8$ layer(c-axis length is 18A). Therefore, an epitaxial growth can be performed when the tunnel barrier layer is formed on the lower oxide superconducting layer and the upper oxide superconducting layer is formed on the tunnel barrier layer. And a crystalline tunnel barrier layer and crystalline oxide superconducting layers can be formed having a good crystallization.

Figure 1:
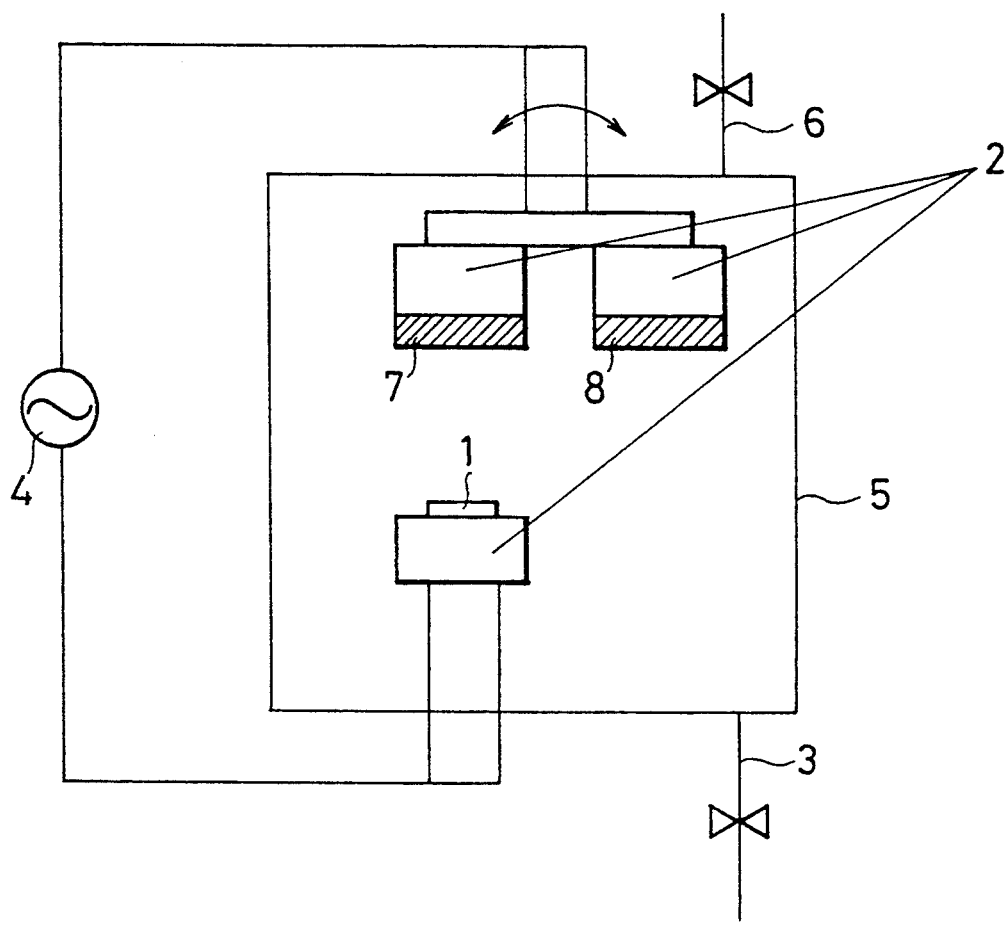
FIG. 1 is a schematic diagram of an RF magnetron sputtering device.

The oxide superconducting layers and the tunnel barrier layer were formed in the form of a film by means of an RF magnetron sputtering device. A general outline of the sputtering device is shown in FIG. 1. Sintered bodies of $Bi_2Sr_2CaCu_3O_9$ 7 and $Bi_3SrO_y$ 8 were used as a pair of sputtering targets 7 and 8. The oxide superconducting $Bi_2Sr_2CaCu_2O_8$ layer and the tunnel barrier $Bi_2SrO_y$ layer were formed by sputtering the $Bi_2Sr_2CaCu_3O_9$ target 7 and the $Bi_3SrO_y$ target 8, respectively. During the sputtering, the compositions of the targets 7 and 8 were converted into the compositions of the oxide superconducting layer and the tunnel barrier layer, respectively. By using targets with such compositions, stoichiometric compositions ($Bi_2Sr_2CaCu_2O_8$ and $Bi_2SrO_y$) were obtained for the films.

The two targets 7 and 8 (sintered bodies of $Bi_2Sr_2CaCu_3O_9$ and $Bi_3SrO_y$) were placed in a chamber 5 at the same time and the oxide superconducting layers and the tunnel barrier layer were formed successively without changing the atmosphere inside the chamber. A (100) cleavage plane of single crystal magnesium oxide was used as a surface on which the lower oxide superconducting layer was formed.

The film formation was carried out at a substrate temperature of 500 degrees Centigrade, using a gas mixture with an oxygen to argon ratio of 1:1 (the total pressure was 100 millitorr), and at a deposition velocity of 3 nm/sec.

Figure 2A:
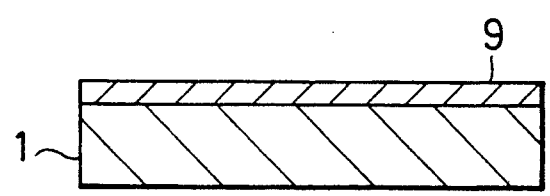
FIG. 2(A) to FIG. 2(C) are a schematic cross sectional view to show a procedure for fabricating a tunnel junction.
Figure 2B:
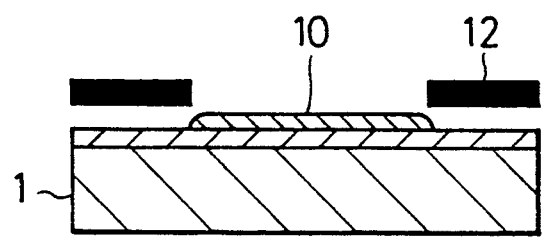

FIG. 2 illustrates a procedure for fabricating a tunnel junction. First, a layer 9 of $Bi_2Sr_2CaCu_2O_8$ was formed to a thickness of about 2000 Å by sputtering the $Bi_2Sr_2CaCu_3O_9$ target as shown in FIG. 2(A), and a mask 12 was provided as shown in FIG. 2(B) and a layer 10 of $Bi_2SrO_y$ was deposited on the layer 9 to a thickness of about 100 Å by sputtering the $Bi_3SrO_y$ target as shown in FIG. 2(B).

Figure 2C:
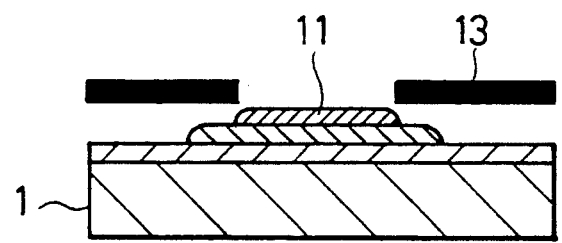

A layer 11 of $Bi_2Sr_2CaCu_2O_8$ was deposited on the layer 10 to a thickness of about 2000 Å by sputtering the $Bi_2Sr_2CaCu_3O_9$ target, using a second mask 13 as shown in FIG. 2(C). This completed the formation of the tunnel junction.

Figure 3:
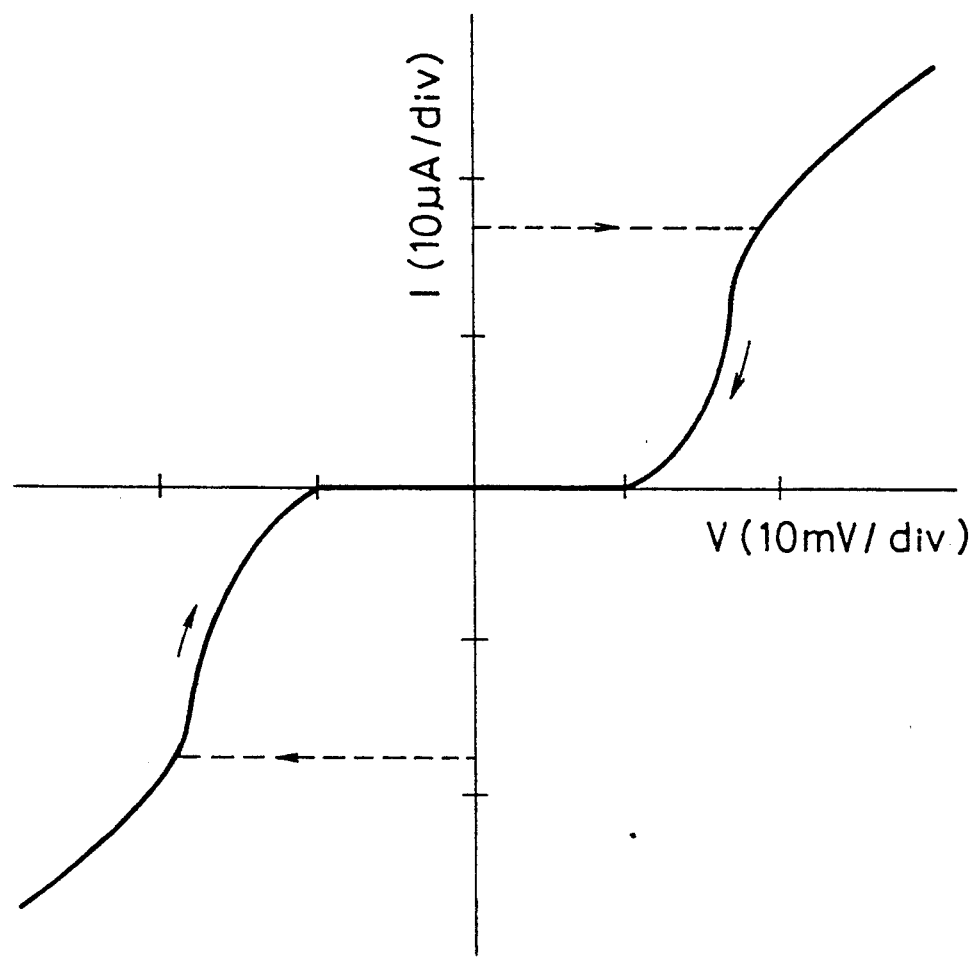
FIG. 3 is a graph showing the relationship between current and voltage of a tunnel junction produced by the present invention.

The epitaxial growth between the tunnel barrier layer and each of the oxide superconducting layers was confirmed by the X-ray diffraction method, the electron diffraction method, and a RHEED pattern. The action of this tunnel junction at the temperature of liquid nitrogen was confirmed as a DC and AC Josephson effect. The current and voltage characteristics at this time are shown in FIG. 3. The high critical temperature was 80 K.

In addition, in the present invention, after the oxide superconducting layers 9 and 11 and the tunnel barrier layer 10 are formed by the sputtering method, the layers may be annealed under an atmosphere of oxygen at a high temperature. Through this annealing the superconductivity of the oxide superconducting layers were improved and each of the oxide superconducting layers became in alignment with the tunnel barrier layer. Thus this annealing was effective in improving the tunnel junction characteristics.

In this embodiment of the present invention, the sputtering method was used to form the oxide superconducting layers and the tunnel barrier layer. However, other formation methods which do not cause an undesirable crystal structure in the tunnel junction can also be used.

Embodiment No. 2

In this embodiment a formation of a tunnel junction comprising a pair of oxide superconducting $Bi_2Sr_2CaCu_2O_8$ layers and a conducting $(Bi_{1-x}Pb_x)_2Sr_2CuO_y$ tunnel barrier layer is shown. These layers have the same a-axis length of a lattice constant and almost the same crystal structure. This $(Bi_{1-x}Pb_x)_2Sr_2CuO_y$ exhibits a temperature versus resistance characteristics similar to that of a metal and does not exhibit a superconducting characteristics. This means that a carrier in the $(Bi_{1-x}Pb_x)_2Sr_2CuO_y$ has a large mean free path. It is thought that the mean free path is about several hundreds angstrom at 77 K. Accordingly a thick $(Bi_{1-x}Pb_x)_2Sr_2CuO_y$ layer can be used as the tunnel barrier layer.

The oxide superconducting layers and the tunnel barrier layer were formed in the form of a film by means of an RF magnetron sputtering device. The sputtering device used was the same as the sputtering device of FIG. 1. However, sintered bodies of $Bi_2Sr_2CaCu_3O_9$ and $(Bi_{1-x}Pb_x)_2Sr_2Cu_{1.5}O_y$ were used as the targets. There are slight differences between the composition of the oxide superconducting layers and that of the corresponding target and also between the composition of the tunnel barrier layer and that of the other target, so that the oxide superconducting layers having a stoichiometric composition $Bi_2Sr_2CaCu_2O_8$ were formed from the $Bi_2Sr_2CaCu_3O_9$ target and the tunnel barrier layer having a stoichiometric composition $(Bi_{1-x}Pb_x)_2Sr_2CuO_y$ was formed from the $(Bi_{1-x}Pb_x)_2Sr_2Cu_{1.5}O_y$ target.

In the same way as the first embodiment, a polished (100) plane of a single crystal of magnesium oxide was used as the surface on which the lower oxide superconducting layer was formed. The film formation was carried out at a substrate temperature of 500 degrees Centigrade, using a gas mixture with an oxygen to argon ratio of 1:1 (total pressure = 100 millitorr), and at a deposition velocity of 3 nm/sec.

The same procedure was used for fabricating a tunnel junction as in the first embodiment. First, a layer 9 of $Bi_2Sr_2CaCu_2O_8$ was formed to a thickness of about 2000 Å. Then the targets were exchanged and a layer 10 of $(Bi_{1-x}Pb_x)_2Sr_2CuO_y$ was deposited on the layer 9 to a thickness of about 100 Å using a first mask 12 as shown in FIG. 2(B). The targets were exchanged again and a layer 11 of $Bi_2Sr_2CaCu_2O_8$ was deposited on the layer 10 to a thickness of about 2000 Å, using a second mask 13 as shown in FIG. 2(C). This completed the formation of the tunnel junction. The epitaxial growth of the oxide superconducting layers and the tunnel barrier layer was confirmed by the X-ray diffraction method, the electron diffraction method, and a RHEED pattern. The action of this tunnel junction at the temperature of liquid nitrogen was confirmed by a DC and AC Josephson effect.

In this embodiment, the oxide superconducting layers and the tunnel barrier layer have the same a-axis length of the lattice constant and almost the same crystal structure, and these layers grew epitaxially and had good crystallizations.

In this embodiment, the tunnel junction may be annealed as in the Embodiment No. 1.

In addition, the same effect as in the Embodiment No. 2 was obtained from a tunnel junction comprising the same oxide superconducting layers as in the Embodiment No. 2 and a tunnel barrier layer using Ca in place of part of the Sr of the $(Bi_{1-x}Pb_x)_2Sr_2CuO_y$.

In the above embodiments the tunnel junction comprising the pair of oxide superconducting $Bi_2Sr_2CaCu_2O_8$ layers and the insulating $Bi_2SrO_y$ layer was described and the tunnel junction comprising the pair of oxide superconducting $Bi_2Sr_2CaCu_2O_8$ layers and the conducting $(Bi_{1-x}Pb_x)_2Sr_2CuO_y$ layer was also described. In addition to the tunnel junctions, a tunnel junction comprising a pair of oxide superconducting $Bi_2Sr_2Ca_{n-1}Cu_nO_{2n+4}$ layers and an insulating $Bi_2Sr_{1-x}Ca_xO_6 (0 \leq X < 1, 3 < y < 4)$ tunnel barrier layer and a tunnel junction comprising a pair of oxide superconducting $Bi_2Sr_2Ca_{n-1}Cu_nO_{2n+4}$ layers and a conducting $(Bi_{1-x}Pb_x)_2Sr_2CuO_y (x=0.1-0.3)$ tunnel barrier layer can be used as a Josephson junction. In these tunnel junctions, the tunnel barrier layers have the same crystal structure or almost the same crystal structure and almost the same lattice constant as the oxide superconducting layers.

By means of the present invention, it has become possible to form a Josephson junction from only a high temperature oxide superconductor. Accordingly, a low cost superconducting device can be fabricated such that operation is feasible when cooled to the temperature of liquid nitrogen. The tunnel junction of the present invention can be used as an element in a Josephson computer, a superconducting transistor, a superconducting quantum interference device (SQUID), and the like. The present invention therefore has considerable potential for industrial application.

Since other modification and changes(varied to fit particular operating requirements and environments) will be apparent to those skilled in the art, the invention is not considered limited to the examples chosen for purposes of disclosure, and covers all changes and modifications which do not constitute departures from the true spirit and scope of this invention.

What is claimed is:

1. A superconducting device comprising:
   a Bi-based high-Tc oxide superconducting layer;
   an epitaxial tunnel barrier layer grown in said oxide superconducting layer; and
   an epitaxial oxide superconducting layer grown on said tunnel barrier layer, said epitaxial oxide superconducting layer being of a different composition than the tunnel barrier layer.

2. The superconducting device of claim 1 wherein said tunnel barrier layer is a conducting layer.

3. The superconducting device of claim 2 wherein said tunnel barrier layer is represented by the formula of $(Bi_{1-x}Pb_x)_2Sr_2CuO_y$ where X is from 0.1 to 0.3 and said pair of oxide superconducting layers are represented by the formula of $Bi_2Sr_2Ca_{n-1}Cu_nO_{2n+4}$ where n is an integer not less than 2.

4. The superconducting device of claim 1 wherein said tunnel barrier layer is a semiconductor layer.

5. The superconducting device of claim 1, wherein said tunnel barrier is an insulating layer.

6. The superconducting device of claim 5 wherein said tunnel barrier layer is represented by the formula of $Bi_2Sr_{1-x}Ca_xO_y$ and said pair of superconducting layers are represented by the formula of $Bi_2Sr_2Ca_{n-1}Cu_nO_{2n+4}$ where $0<X<1$ and $3<Y<4$ and n is an integer not less than 1.

7. A superconducting device comprising:
   a Bi-based high-TC oxide superconducting layer;
   an epitaxial tunnel barrier layer grown on said oxide superconducting layer, said tunnel barrier layer being made of oxide and being of a different composition than the Bi-based superconducting layer; and
   an epitaxial oxide superconducting layer grown on said tunnel barrier layer, said epitaxial oxide superconducting layer being of a different composition than the tunnel barrier layer.

8. The superconducting device of claim 7 wherein said tunnel barrier layer is a conducting layer.

9. The superconducting device of claim 8 wherein said tunnel barrier layer is represented by the formula of $(Bi_{1-x}Pb_x)_2Sr_2CuO_y$ where X is from 0.1 to 0.3 and said pair of oxide superconducting layers are represented by the formula of $Bi_2Sr_2Ca_{n-1}Cu_nO_{2n+4}$ where n is an integer not less than 2.

10. The superconducting device of claim 7 wherein said tunnel barrier layer is a semiconductor layer.

11. The superconducting device of claim 7, wherein said tunnel barrier is an insulating layer.

12. The superconducting device of claim 11 wherein said tunnel barrier layer is represented by the formula of $Bi_2Sr_{1-x}Ca_xO_y$ and said pair of superconducting layers are represented by the formula of $Bi_2Sr_2Ca_{n-1}Cu_nO_{2n+4}$ where $0<X<1$ and $3<Y<4$ and n is an integer not less than 1.

13. A superconducting device comprising:
   an oxide high-Tc superconducting layer;
   an epitaxial tunnel barrier layer grown on said oxide superconducting layer, said tunnel barrier layer having a thickness of about 100 Å and being of a different composition than the oxide superconducting layer; and
   an epitaxial oxide superconducting layer grown on said tunnel barrier layer, said epitaxial oxide superconducting layer being of a different composition than the tunnel barrier layer.

14. The superconducting device of claim 13 wherein said tunnel barrier layer is a conducting layer.

15. The superconducting device of claim 14 wherein said tunnel barrier layer is represented by the formula of $(Bi_{1-x}Pb_x)_2Sr_2CuO_y$ where X is from 0.1 to 0.3 and said pair of oxide superconducting layers are represented by the formula of $Bi_2Sr_2Ca_{n-1}Cu_nO_{2n+4}$ where n is an integer not less than 2.

16. The superconducting device of claim 13 wherein said tunnel barrier layer is a semiconductor layer.

17. The superconducting device of claim 13, wherein said tunnel barrier is an insulating layer.

18. The superconducting device of claim 17 wherein said tunnel barrier layer is represented by the formula of $Bi_2Sr_{1-x}Ca_xO_y$ and said pair of superconducting layers are represented by the formula of $Bi_2Sr_2Ca_{n-1}Cu_nO_{2n+4}$ where $0<X<1$ and $3<Y<4$ and n is an integer not less than 1.

* * * * *